United States Patent
Kobayashi et al.

(10) Patent No.: US 10,263,392 B2
(45) Date of Patent: Apr. 16, 2019

(54) OPTICAL WAVEGUIDE, AND OPTICAL COMPONENT AND VARIABLE WAVELENGTH LASER WHICH USE THE SAME

(71) Applicant: NEC CORPORATION, Tokyo (JP)

(72) Inventors: Naoki Kobayashi, Tokyo (JP); Kenji Sato, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/870,231

(22) Filed: Jan. 12, 2018

(65) Prior Publication Data
US 2018/0138659 A1    May 17, 2018

Related U.S. Application Data

(63) Continuation of application No. 15/123,814, filed as application No. PCT/JP2015/000976 on Feb. 26, 2015, now Pat. No. 9,899,799.

(30) Foreign Application Priority Data

Mar. 7, 2014    (JP) .................................. 2014-044935

(51) Int. Cl.
*G02B 6/122* (2006.01)
*G02B 6/12* (2006.01)
(Continued)

(52) U.S. Cl.
CPC .............. *H01S 5/142* (2013.01); *G02B 6/122* (2013.01); *G02B 6/12007* (2013.01);
(Continued)

(58) Field of Classification Search
CPC . G02B 6/10; G02B 6/107; G02B 6/12; G02B 6/12007; G02B 2006/12061;
(Continued)

(56) References Cited

U.S. PATENT DOCUMENTS 6,890,450 B2    5/2005   Naydenkov et al.
7,020,367 B2    3/2006   Suzuki et al.
(Continued)

FOREIGN PATENT DOCUMENTS

CN    1502051 A    6/2004
JP    2002162528 A    6/2002
(Continued)

OTHER PUBLICATIONS

Michael Gould et al., "Ultra-thin silicon-on-insulator strip waveguides and mode couplers", Applied Physics Letters, 2012, pp. 221106-1-221106-3, vol. 101.
(Continued)

*Primary Examiner* — John Bedtelyon
(74) *Attorney, Agent, or Firm* — Sughrue Mion, PLLC

(57) ABSTRACT

Provided are: an optical waveguide that relatively easily expands a spot size and that can suppress an increase in optical coupling loss with another optical waveguide element; and an optical component and variable-wavelength laser that use the optical waveguide. The optical waveguide is provided with: a cladding member; and a core layer that is disposed within the cladding member and that is formed as an elongated body having a rectangular cross-sectional shape from a material having a higher refractive index than the material configuring the cladding member. Here, the cross-sectional shape of the core layer is characterized in having a rectangular shape in which the length in the lateral direction is at least 10 times the length in the vertical direction.

13 Claims, 5 Drawing Sheets

(51) Int. Cl.
*G02B 6/293* (2006.01)
*H01S 5/14* (2006.01)
*H01S 5/10* (2006.01)

(52) U.S. Cl.
CPC ....... *G02B 6/1228* (2013.01); *G02B 6/29338* (2013.01); *H01S 5/1032* (2013.01)

(58) Field of Classification Search
CPC .... G02B 2006/12038; G02B 2006/121; G02B 6/29338; G02B 6/1228; G02B 6/122; H01S 5/1032; H01S 5/142
See application file for complete search history.

(56) References Cited

U.S. PATENT DOCUMENTS

| 8,837,548 | B2 | 9/2014 | Tanaka |
| 2002/0146205 | A1 | 10/2002 | Shimoda |
| 2009/0122817 | A1 | 5/2009 | Sato et al. |

FOREIGN PATENT DOCUMENTS

| JP | 2002303752 A | 10/2002 |
| JP | 2003043279 A | 2/2003 |
| JP | 200866318 A | 3/2008 |
| WO | 2008111447 A1 | 9/2008 |
| WO | 2013021421 A1 | 2/2013 |

OTHER PUBLICATIONS

Shuyu Yang et al., "A single adiabatic microring-based laser in 220nm silicon-on-insulator", Optics Express, Jan. 13, 2014, pp. 1172-1180, vol. 22, No. 1.
International Search Report of PCT/JP2015/000976 dated May 26, 2015.
Communication dated Aug. 21, 2018, from the Japanese Patent Office in counterpart application No. 2018-007771.
Communication dated Sep. 7, 2018, from State Intellectual Property Office of the P.R.C. in counterpart application No. 201580011932.9.

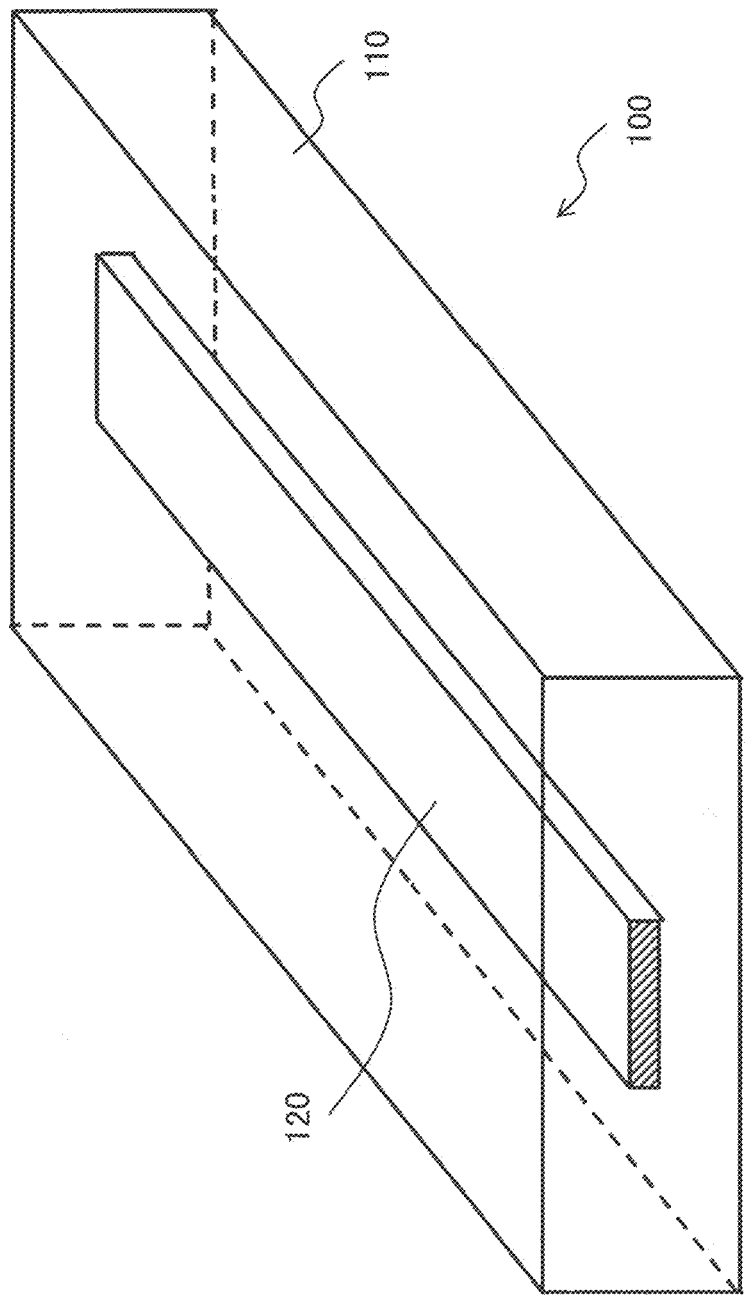

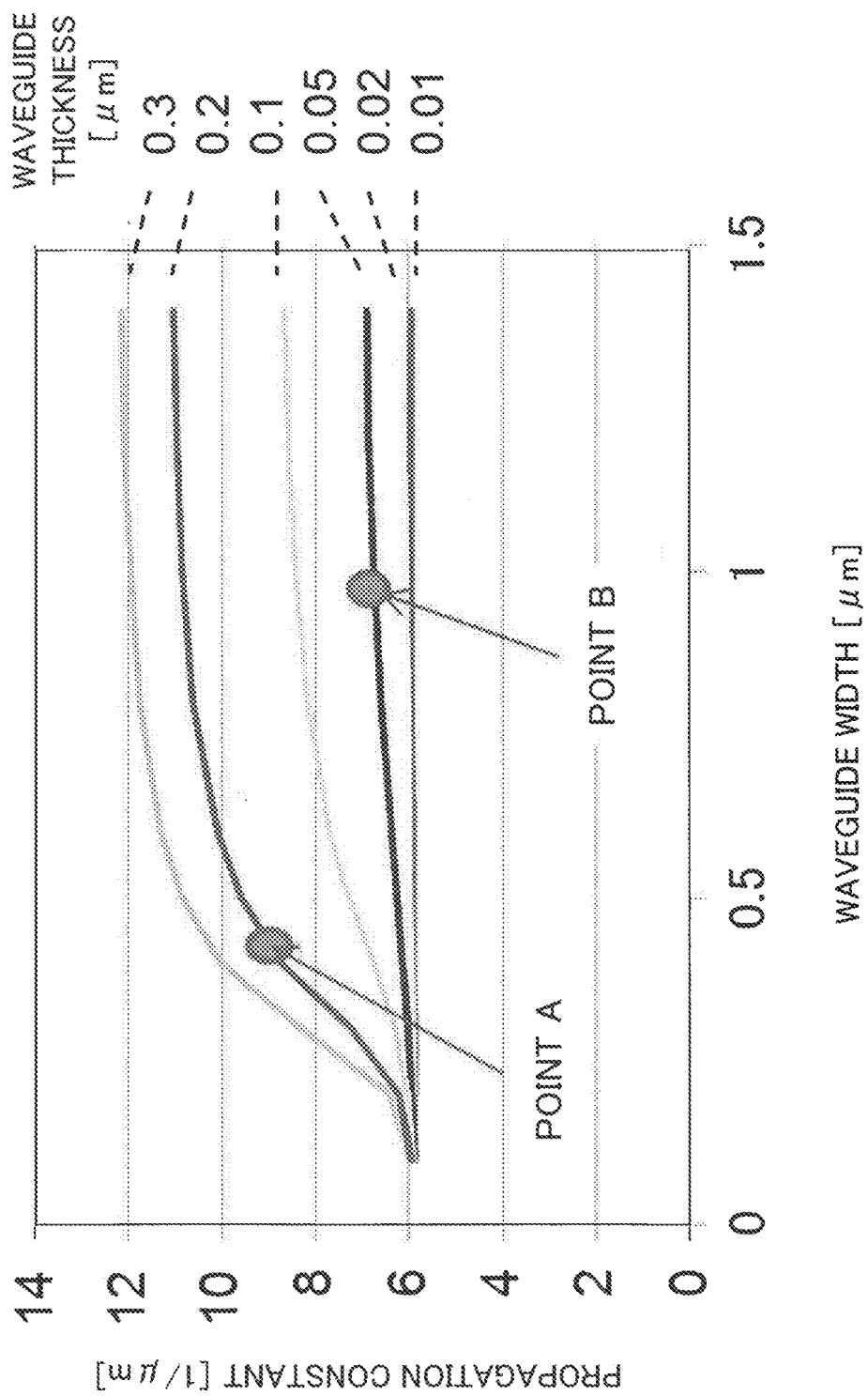

OPTICAL WAVEGUIDE, AND OPTICAL COMPONENT AND VARIABLE WAVELENGTH LASER WHICH USE THE SAME

This application is a continuation of U.S. application Ser. No. 15/123,814, filed Sep. 6, 2016, which is a National Stage of International Application No. PCT/JP2015/000976 filed Feb. 26, 2015, claiming priority based on Japanese Patent Application No. 2014-044935, filed Mar. 7, 2014, the contents of each of which are incorporated herein by reference in their entirety.

TECHNICAL FIELD

The present invention relates to an optical waveguide, and an optical component and a variable wavelength laser which use the same, and particularly relates to an optical waveguide provided with a thin-wire optical waveguide, and an optical component and a variable wavelength laser which use the same.

BACKGROUND ART

Developed and application of Planar Optical Circuits (PLC: Planar Lightwave Circuit) have been advanced mainly in quartz-based types, and they have played an important role as a key component underpinning recent optical communication markets in Array Waveguide Gratings (AWG) or splitters among other things. Recently, development of a new functional element has also been advanced, such as a wavelength variable light source having a compound semiconductor amplifier (SOA: Semiconductor Optical Amplifier) hybrid-mounted on a quartz-based PLC. It has been actively explored to mount an active element and a passive element together on a common PLC substrate, to implement a small-sized inexpensive system on one chip.

However, with required functions being increasingly complicated and advanced, the size of elements and driving electrical-power-consumption in PLCs has increased, and limitations have emerged in functions and performances achievable by using quartz-based types. For this reason, research and development of SOI (Silicon on Insulator) waveguides utilizing silicon microfabrication technologies such as silicon thin-wires and Photonic Crystals (PCs) has attracted attention, and their feasibility is examined for key components having small-sized, low electrical-power-consuming, and inexpensive characteristics.

In SOI waveguides, silicon was used as a core material to increase the difference of specific refractive index from that of cladding materials ($SiO_2$ and its dielectrics), to achieve miniaturization. Quartz-based waveguides have a difference of specific refractive index $\Delta$ of about 5% and a bending radius of about 500 μm, while $\Delta$ of silicon thin-wire optical waveguides is 40% or more and their bending radius can be decreased down to a few μm. For this reason, silicon thin-wires enable significant reduction in the PLC size.

However, when the difference of specific refractive index is increased, the core diameter must be decreased to satisfy a single mode condition for propagating light, and this causes a difference of spot size from that of other waveguide elements such as optical fiber, resulting in increase in loss of optical coupling. In view of this, PTL1 and PTL2, for example, disclose a technology for enlarging the spot size. In PTL2, the disclosed technology enlarges the spot size by forming an output/input region of a silicon thin-wire optical waveguide into a tapered shape such that the width and thickness of the core layer are each decreased in a direction of light propagation.

CITATION LIST

Patent Literature

[PTL1] Japanese Patent Application Laid-open No. 2002-162528
[PTL2] International Publication No. 2008/111447

SUMMARY OF INVENTION

Technical Problem

However, since silicon thin-wire optical waveguides intrinsically have a small core diameter and a high light-confinement rate, a sufficiently long taper must be secured in order to enlarge the spot size. In addition, the fabrication process of the taper becomes complicated when reducing each of the width and thickness of the core layer in a direction of light propagation.

The present invention has been carried out in view of the above-mentioned problems, and an object thereof is to provide an optical waveguide which enables relatively easy enlargement of the spot size to inhibit increase in the loss of optical coupling with other waveguide elements, and an optical component and a variable wavelength laser which use the same.

Solution to Problem

To achieve the above-mentioned object, an optical wave guide according to the present invention includes: a cladding member; and a core layer which is disposed in the cladding member and is formed into an elongated body having a rectangular cross-sectional shape from a material having a refractive index higher than that of a material constituting the cladding member, wherein the cross-sectional shape of the core layer is a rectangle having a length in a lateral direction 10 times or more as long as a length in a vertical direction.

To achieve the above-mentioned object, an optical component according to the present invention includes the optical wave guide.

To achieve the above-mentioned object, a variable wavelength laser according to the present invention includes: a ring oscillator comprising the ring oscillator and a compound semiconductor amplifier, wherein a connection side end of the core layer of the ring oscillator connected to the compound semiconductor amplifier is formed into a tapered shape having a decreasing length in a lateral direction.

Advantageous Effect of Invention

The above-described aspect of the present invention enables relatively easy enlargement of the spot size to inhibit increase in the loss of optical coupling with other waveguide elements.

BRIEF DESCRIPTION OF DRAWINGS

FIG. 1 is a transparent perspective view of an optical waveguide 100 according to a first exemplary embodiment.

FIG. 3 is a graph indicating a light propagation constant for each cross-section of a silicon waveguide.

DESCRIPTION OF EMBODIMENTS

<First Exemplary Embodiment>

A first exemplary embodiment according to the present invention will be explained. An optical waveguide according to this exemplary embodiment is depicted as a transparent perspective view in FIG. 1. In FIG. 1, the optical waveguide 100 is constituted by a cladding member 110 and a silicon flattened optical waveguide 120.

The cladding member 110 is made of a material such as $SiO_2$ and its dielectrics, and the silicon flattened optical waveguide 120 is disposed inside the cladding member 110. The cladding member 110 is formed on a non-illustrated substrate such as a silicon substrate by depositing $SiO_2$, by using, for example, silicon microfabrication technologies.

The silicon flattened optical waveguide 120 is made of a material having a higher refractive index than that of the cladding member 110, and light signals propagate through the silicon flattened optical waveguide 120. The silicon flattened optical waveguide 120 according to this exemplary embodiment is formed into a rectangular parallelepiped shape having a cross-section the aspect ratio of which is about 1:10. For example, the silicon flattened optical waveguide 120 is formed into a shape of 1.0 μm in optical waveguide width and 0.05 μm in optical waveguide thickness (aspect ratio is 1:20) by silicon microfabrication technologies such as CMOS (Complementary Metal Oxide Semiconductor) processes. The dimension of the optical waveguide width and the optical waveguide thickness of the silicon flattened optical waveguide 120 are not limited to the above-mentioned values so long as the ratio of the optical waveguide width to the optical waveguide thickness is 10 or more.

Figure 2A:
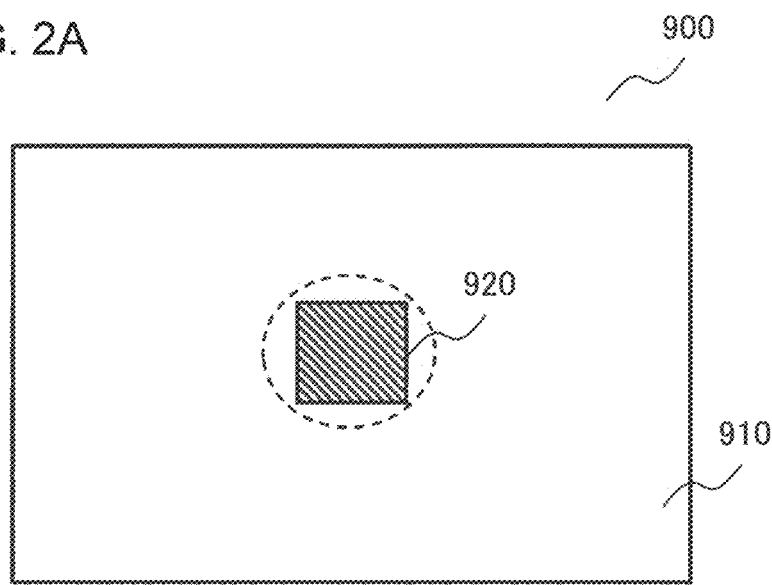
FIG. 2A is a cross-sectional view of a conventional optical waveguide 900.

Operation of the optical waveguide 100 according to this exemplary embodiment will be explained in comparison with a conventional waveguide 900. FIG. 2A depicts a cross-sectional view of the conventional waveguide 900, and FIG. 2B depicts that of the optical waveguide 100 according to this exemplary embodiment.

As shown in FIG. 2A, the conventional waveguide 900 is constituted by a cladding member 910 and a silicon thin-wire optical waveguide 920. The cladding member 910 is configured in a similar manner to that of the cladding member 110 of the optical waveguide 100 according to this exemplary embodiment. On the other hand, the silicon thin-wire optical waveguide 920 is formed into a rectangular parallelepiped shape of nearly 0.4 μm in waveguide width and nearly 0.2 μm in waveguide thickness, with the aspect ratio being about 1:2. In other words, the aspect ratio of the silicon flattened optical waveguide 120 of the optical waveguide 100 according to this exemplary embodiment is about ten times as large as that of the thin-wire optical waveguide 920 of the conventional waveguide 900.

Figure 2B:
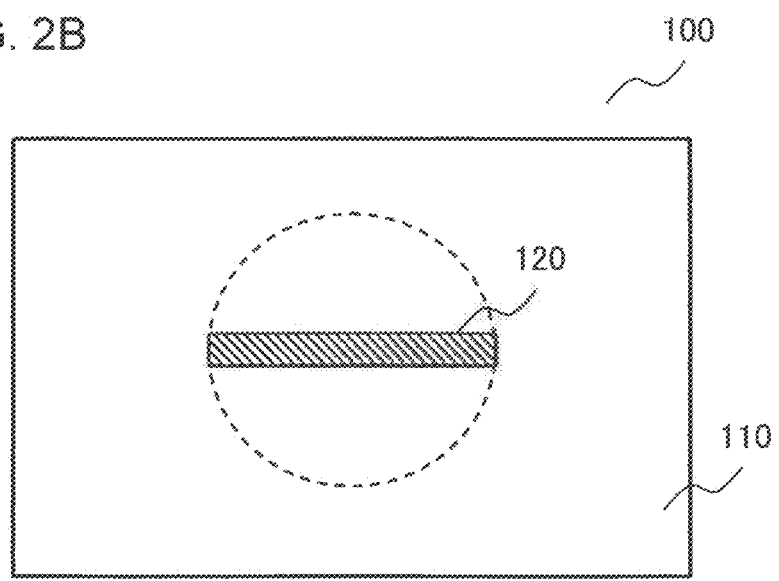
FIG. 2B is a cross-sectional view of an optical waveguide 100 according to the exemplary embodiment.

FIG. 2A, FIG. 2B depict a spread of a light signal for communication of 1.3 to 1.55 μm in wavelength injected into the conventional silicon thin-wire optical waveguide 920 of FIG. 2A and into the silicon flattened optical waveguide 120 according to this exemplary embodiment of FIG. 2B, respectively.

As shown in FIG. 2A, most of light intensity of the light signal injected into the silicon thin-wire optical waveguide 920 of the conventional waveguide 900 is distributed within the cross-section of the silicon thin-wire optical waveguide 920. The reason for this is that the width and the thickness of the silicon thin-wire optical waveguide 920 are formed into dimensions such that light signals are confined easily. In the conventional waveguide 900, in order to minimize the size of optical devices, light confinement rate is designed to be as high as possible so that radiation loss of light is in a negligible level even for bent waveguides. For example, in the conventional waveguide 900, the light loss becomes approximately 0 dB even for a very small bent waveguide having a radius of curvature of 10 μm.

On the other hand, as shown in FIG. 2B, most of the light intensity of the light signal injected into the silicon flattened optical waveguide 120 of the optical waveguide 100 according to this exemplary embodiment is distributed outside the cross-section of the silicon flattened optical waveguide 120. The reason for this is that the thickness of the silicon flattened optical waveguide 120 is thin, and therefore, the light signal cannot be perfectly confined in the thickness direction, leading to a distribution where a large part of the light intensity distribution is outside the cross-section of the silicon flattened optical waveguide 120.

As described above, since the optical waveguide 100 according to this exemplary embodiment has a small light confinement rate, the radius of curvature is difficult to be reduced. However, in the optical waveguide 100 according to this exemplary embodiment, the following effects can be actualized by the aspect ratio, greater than or equal to 10, of the cross-sectional shape of the silicon flattened optical waveguide 120.

The first effect is that the optical waveguide 100 according to this exemplary embodiment can reduce a scattering loss down to about one tenth of that of the conventional waveguide 900, which scattering loss is caused by side-surface roughness (roughness) of the waveguide. As for the propagation loss of light, most of the loss comes from scattering loss in the sidewall roughness of a waveguide in the case of a material, such as silicon, which does not absorb light in itself. In particular, when the rate of light confinement into a core is large as in the case of silicon thin-wire optical waveguide 920, light on the sidewall of the core is intense and scattering loss significantly appears in comparison to waveguides in a different structure or of a different material.

FIG. 3 depicts a change in a light propagation constant for each cross-sectional structure of the silicon waveguide. In FIG. 3, the slope of the propagation constant is equivalent to a magnitude of the influence of the sidewall roughness of the waveguides. For example, in the case of the waveguide width of 0.1 to 0.5 μm, increase in the waveguide thickness up to 0.1 μm or more leads to a great variation in the propagation constant in response to the change in the waveguide width. In other words, in the case of the aspect ratio of about 1:1 to 2 of the cross-section of the silicon waveguide, the variation of the waveguide width caused by the roughness among other things leads to a variation of the propagation constant, sensitive to the variation of the waveguide width.

In FIG. 3, Point A and Point B indicate a position corresponding to the waveguide 900 having the silicon thin-wire optical waveguide 920 and a position corresponding to the optical waveguide 100 according to this exemplary embodiment having the silicon flattened optical waveguide 120, respectively. The conventional waveguide 900 (Point A) is significantly influenced by roughness because the propagation constant greatly varies in response to the change in the waveguide width. On the other hand, the slope of the propagation constant of the optical waveguide 100 according to this exemplary embodiment (Point B) is about one tenth of that of the waveguide 900 (Point A), and the influence of the sidewall roughness is reduced down to about one tenth of that of the waveguide 900 in the optical waveguide 100.

The second effect is that the optical waveguide 100 according to this exemplary embodiment can provide a satisfactory optical coupling with optical waveguides based on a different material, only by narrowing the width of the silicon flattened optical waveguide 120. The silicon thin-wire optical waveguide 920 of the conventional waveguide 900 has a smaller cross-section than other optical waveguides, causing a large difference of light beam diameter in a connection portion of optical waveguides. For example, the light beam diameter in an optical fiber is about 10 µm, which is quite different from a submicron beam diameter of the silicon thin-wire optical waveguide 920. Therefore, it is proposed to enlarge the beam diameter of the silicon thin-wire optical waveguide 920 to conform the beam diameter to that of other optical waveguides.

Figure 4A:
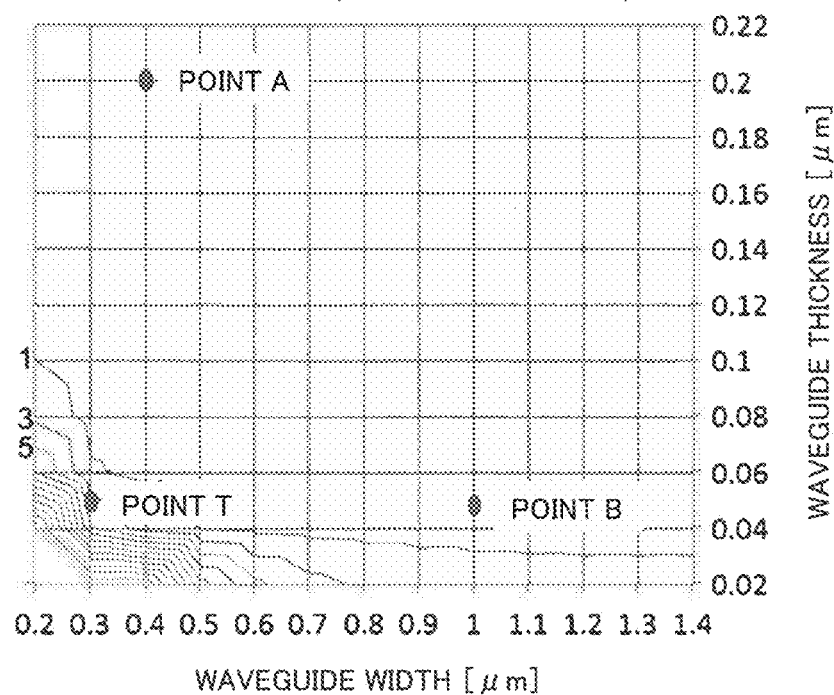
FIG. 4A is a graph indicating a relationship between the structure of a waveguide and a beam diameter, in the lateral direction, of light propagating through the waveguide, along with lateral direction.
Figure 4B:
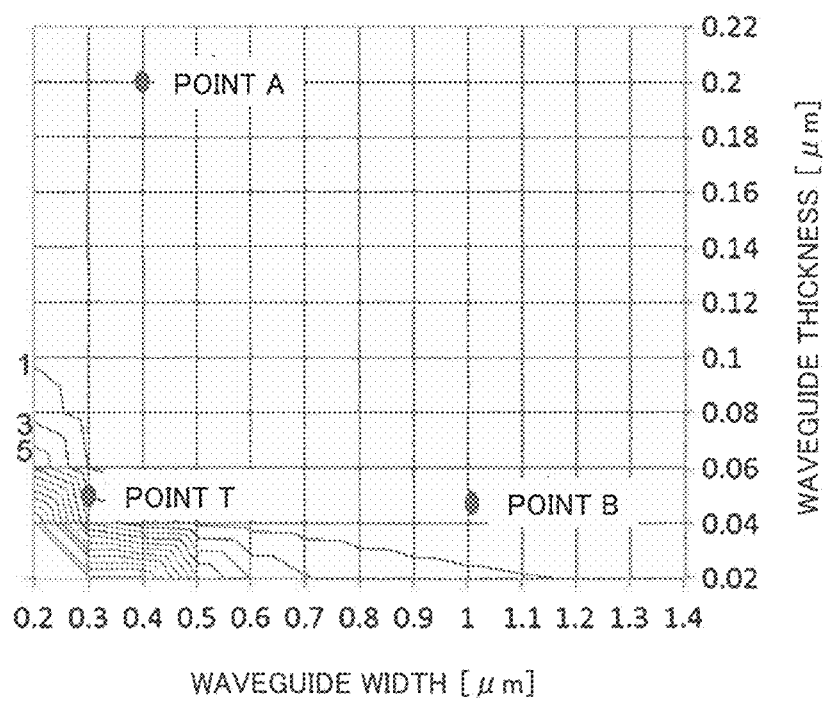
FIG. 4B is a graph indicating a relationship between the structure of the waveguide and the beam diameter, in the vertical direction, of light propagating through the waveguide.

FIG. 4A and FIG. 4B depict a relation between a waveguide structure and a beam diameter of light propagating through the waveguide. For example, when a laser is constituted by a combination of the conventional waveguide 900 and an SOA, in order to conform the beam diameter of the optical waveguide based on InP, which is a raw material of the SOA, to the beam diameter of the silicon thin-wire optical waveguide 920, the SOA waveguide and the silicon thin-wire optical waveguide 920 are each processed to be formed into a tapered shape so that their beam shape becomes a circle of 3 µm in diameter.

In FIG. 4A and FIG. 4B, Point T, Point A, and Point B indicate a position where the beam diameter is 3 µm or more, a position corresponding to the waveguide 900 having the silicon thin-wire optical waveguide 920, and a position corresponding to the optical waveguide 100 according to this exemplary embodiment having the silicon flattened optical waveguide 120, respectively. As shown in FIG. 4A, FIG. 4B, Point T is 0.3 µm in waveguide width and nearly 0.05 µm in waveguide thickness; Point A is nearly 0.4 µm in waveguide width and nearly 0.2 µm in waveguide thickness; Point B is nearly 1.0 µm in waveguide width and nearly 0.05 µm in waveguide thickness.

Further, when the waveguide 900 is connected to the SOA, a structure such as a two-dimensional tapered structure in which both of the waveguide width and the waveguide thickness are both changed or a two-step cladding structure is used to reduce the waveguide size down to a point where the beam diameter of the silicon thin-wire optical waveguide 920 (Point A) becomes 3 µm (Point T). However, when the two-dimensional tapered structure or the two-step cladding structure is applied, its process becomes complicated. Further, since the silicon thin-wire optical waveguide 920 strongly confines light signal therein, the light beam diameter cannot be readily enlarged only by changing the waveguide size.

On the other hand, when a laser is constituted by a combination of the optical waveguide 100 according to this exemplary embodiment and the SOA, the waveguide thickness does not have to be changed, as shown in FIG. 4A, FIG. 4B, and a desirable beam diameter can be obtained by a structure laterally tapered in one direction in which the waveguide width varies from about 1.0 µm to nearly 0.3 µm. Further, the silicon flattened optical waveguide 120 according to this exemplary embodiment intrinsically has small light confinement rate, and therefore, the size of the light beam diameter can be readily adjusted. Accordingly, the loss of optical coupling to other optical elements, such as SOAs, based on a different material can be readily reduced.

The third effect is that when a laser is constituted by a combination of the optical waveguide 100 according to this exemplary embodiment and the SOA, the laser can be operated more stably than in the case of a combination of the conventional waveguide 900 and the SOA.

As described above, the conventional waveguide 900 exhibits a large roughness scattering, and in this case, reflection of light becomes larger at scattering points. A laser using such an optical waveguide 900 as an external resonator leads to unstable laser operation owing to unnecessary internal reflection.

In contrast to this, when a laser is constituted by a combination of the optical waveguide 100 according to this exemplary embodiment and the SOA, the influence of the sidewall roughness of the waveguide is small, and the amount of the internal reflection within the waveguide is also small. Accordingly, it is possible to constitute a stably operating laser by using the optical waveguide 100 according to this exemplary embodiment as an external resonator.

The fourth effect is that the optical waveguide 100 according to this exemplary embodiment can reduce absorption loss of light within the silicon flattened optical waveguide 120 in comparison to the conventional waveguide 900. The light absorption of silicon is in a negligible level for a single material, but as light density becomes high, two-photon absorption occurs significantly, leading to larger light loss. When two-photon absorption occurs, the amount of the light absorption also increases with increase in output power of laser light, and as a result, the light output power saturates.

In contrast to this, since the optical waveguide 100 according to this exemplary embodiment has the flattened optical waveguide 120 which has a smaller light confinement rate than that of the silicon thin-wire optical waveguide 920, it is not greatly influenced by light absorption in the silicon flattened optical waveguide 120. In other words, since light density is low in the silicon flattened optical waveguide 120, it is, in particular, scarcely influenced by absorption, such as two-photon absorption, which is proportional to the square of light intensity.

As described above, there is an advantage described below to applying the silicon flattened optical waveguide 120 having a cross-sectional aspect ratio of about 1:10, comparing with applying the conventional silicon thin-wire optical waveguide 920 having a cross-sectional aspect ratio of about 1:1 to 2. In other words, an optical waveguide can be constituted, in spite of difficulty in reducing the radius of curvature thereof, which optical waveguide exhibits small scattering loss caused by the influence of the side surface roughness thereof, a small amount of the internal reflection therein, and small two-photon absorption.

Not that the above-mentioned effects appear within a range where the aspect ratio of the cross-sectional shape of the silicon flattened optical waveguide 120 is 10 or more. For example, in the case of FIG. 3, FIG. 4A, and FIG. 4B, this is within the rage where the waveguide width of the silicon flattened optical waveguide 120 is 0.8 to 1.4 μm and the waveguide thickness thereof is 0.02 to 0.08 μm. Further, more significant effects appear within the range where the waveguide width of the silicon flattened optical waveguide 120 is 0.9 to 1.2 μm and the waveguide thickness thereof is 0.04 to 0.06 μm.

<Second Exemplary Embodiment>

A second exemplary embodiment will be explained. This exemplary embodiment applies a variable wavelength laser, as an external resonator, which uses a Si photonics element provided with the silicon flattened optical waveguide 120 explained in the first exemplary embodiment. The variable wavelength laser according to this exemplary embodiment is constituted by not only an optical resonator constituted by planar optical waveguides such as PLCs, but also a laser diode (LD) or an SOA directly implemented on the PLCs.

Figure 5:
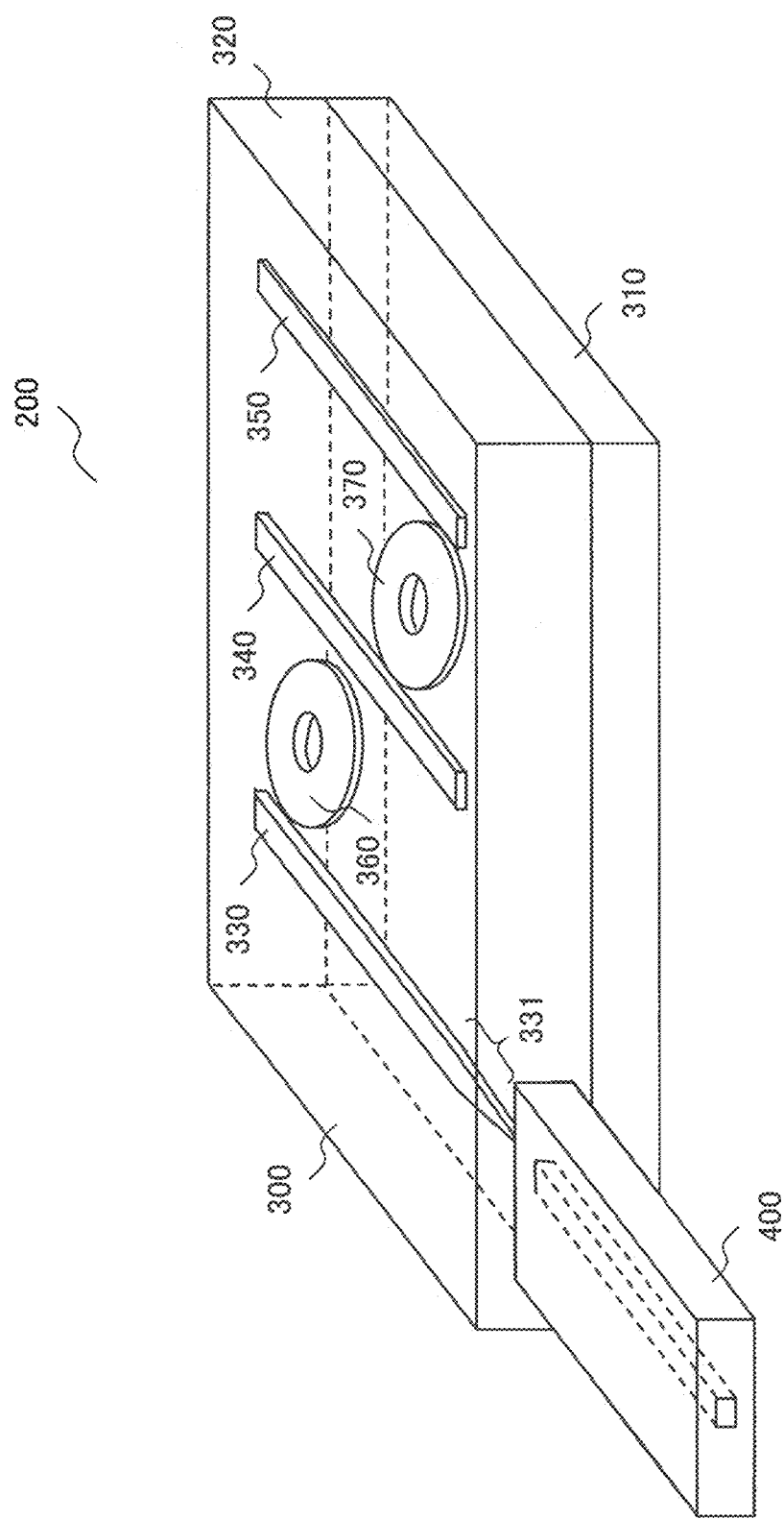
FIG. 5 is a transparent perspective view of a variable wavelength laser 200 according to a second exemplary embodiment.

FIG. 5 depicts a transparent perspective view of the variable wavelength laser according to this exemplary embodiment. In FIG. 5, the variable wavelength laser 200 is constituted by a Si photonics element 300 and an SOA 400. The Si photonics element 300 is constituted by a silicon substrate 310, a cladding member 320, a first silicon flattened optical waveguide 330, a second silicon flattened optical waveguide 340, a third silicon flattened optical waveguide 350, a first silicon flattened ring waveguide 360, and a second silicon flattened ring waveguide 370.

The cladding member 320 is formed on the silicon substrate 310. The cladding member 320 is the same as the cladding member 110 explained in the first exemplary embodiment.

In the cladding member 320, the silicon flattened optical waveguides 330, 340, and 350, and the silicon flattened ring waveguides 360 and 370 are aligned so as to constitute a loop mirror.

The silicon flattened optical waveguides 330, 340, and 350 are each formed in the same manner as in the case of the silicon flattened optical waveguide 120 explained in the first exemplary embodiment. In other words, the silicon flattened optical waveguides 330, 340, and 350 are each formed into a shape of 1.0 μm in optical waveguide width, 0.05 μm in optical waveguide thickness, and about 1:20 in cross-sectional aspect ratio.

The silicon flattened ring waveguides 360 and 370 constitute a ring oscillator which utilizes a slight difference of the circumferential length between each of the waveguides, to generate the vernier effect, in which both peaks match to each other to provide a desirable wavelength within a variable wavelength range. Thereby, a stable single-mode oscillation can be achieved in the variable wavelength laser 200. The silicon flattened ring waveguides 360, 370 only have to be able to constitute a ring oscillator, and the number of the silicon flattened ring waveguides is not limited to two.

Then, by the loop mirror constituted by the silicon flattened optical waveguides 330, 340, 350, and the silicon flattened ring waveguides 360, and 370, light emitted from the SOA 400 makes round-trips, and oscillates at the wavelength selected by the ring oscillator (silicon flattened ring waveguides 360 and 370) between the mirror and the emitting end of the SOA 400, to achieve laser-resonance.

The first silicon flattened optical waveguide 330 has a connection side formed into a laterally tapered structure 331, which side is connected to the optical waveguide of the SOA 400. In other words, the connection interface of the first silicon flattened optical waveguide 320 with the optical waveguide of the SOA 400 is adjusted so that the beam shape becomes a circle of 3 μm in diameter, by applying a laterally tapered structure 331 in which the waveguide width changes from about 1.0 μm to nearly 0.3 μm, with the waveguide thickness kept constant. Thereby, connection loss upon connecting the first silicon flattened optical waveguide 330 to the SOA 400 is reduced down to 0.1 dB or less.

As the laterally tapered structure 331 may be applied not only a linear taper where the waveguide width changes linearly, but also an exponential taper where the waveguide width changes exponentially. Note that the exponential taper can reduce the loss than the linear taper.

In addition, it is desirable to apply non-reflective coating to the connection interface between the cladding member 320 and the SOA 400. The applied non-reflective coating can prevent light reflection at an emitting end from generating larger connection loss. When the connection interface of the SOA 400 is constituted by a material, such as silica, different from semiconductors, the connection portion of the SOA 400 may be coated with a material such as gel for adjusting refractive index, and in addition, a coating which is non-reflective against the gel for adjusting refractive index may be formed on the connection interface of the SOA 400.

The above-mentioned variable wavelength laser 200 as-is exhibits the four effects explained in the first exemplary embodiment because, in the Si photonics element 300 constituting an external resonator, the silicon flattened optical waveguides 330, 340, and 350 are used which are constituted in the same manner as in the case of the silicon flattened optical waveguide 120 explained in the first exemplary embodiment. In other words, since the variable wavelength laser 200 according to this exemplary embodiment is characterized in that the silicon flattened optical waveguides 330, 340 and 350 have low propagation loss, low internal reflection, and low coupling loss, the laser can oscillate at low electrical power and achieve stable laser resonance in a desirable wavelength.

Note that the above-mentioned effects are significantly exhibited in DBR-LDs (Distributed Bragg reflector laser diodes) which have a long resonator length. In other words, since DBR-LDs have many resonance points in the device, RIN (Relative Intensity Noise) becomes large when scattering loss caused by the influence of the roughness is large. Therefore, when the silicon flattened optical waveguides 330, 340, and 350 according to this exemplary embodiment is applied for an external resonator, a DBR-LD having small RIN can be provided.

The present application invention is not limited to the above-mentioned exemplary embodiments, and the invention encompasses any design change without departing from the spirit of the invention.

INDUSTRIAL APPLICABILITY

The invention in the present application can be widely applied for optical waveguides connected to silicon thin-wire optical waveguides.

This application is based upon and claims the benefit of priority from Japanese patent application No. 2014-044935, filed on Mar. 7, 2014, the disclosure of which is incorporated herein in its entirety by reference.

REFERENCE SIGNS LIST

100 Optical waveguide
110 Cladding member
120 Silicon flattened optical waveguide 200 Variable wavelength laser
300 Si photonics element
310 Silicon substrate
320 Cladding member
330, 340, 350 Silicon flattened optical waveguide
360, 370 Silicon flattened ring waveguide
400 SOA
900 Optical waveguide
910 Cladding member
920 Silicon thin-wire optical waveguide

The invention claimed is:

1. An external resonator by a variable wavelength laser comprising:
   a cladding member; and
   a core disposed in the cladding member having a refractive index higher than that of a material of the cladding member, wherein
   the core comprises a first portion and a second portion,
   the first portion has a cross section having a first length in width direction and a second length in thickness direction, the first length being 10 times or more than the second length,
   the second portion tapers toward an end of the core coupled with an amplifier compromising an optical wavelength element, and adjust a beam spot size at the end of the core to a beam spot size at the optical waveguide, element, and
   the end of the core has a cross section having the second length in thickness direction.

2. The external resonator by a variable wavelength laser according to claim 1, wherein the second portion tapers from substantially 1.0 µm to substantially 0.3 µm.

3. The external resonator by a variable wavelength laser according to claim 1, wherein the second portion tapers exponentially.

4. The external resonator by a variable wavelength laser according to claim 1, wherein the second portion tapers linearly.

5. The external resonator by a variable wavelength laser according to claim 1, further comprising a first ring core disposed in the cladding member and having a refractive index higher than that of a material of the cladding member, wherein
   the first ring core has a cross section having a third length in width direction and the second length in thickness direction, the third length being 10 times or more than the second length.

6. The external resonator by a variable wavelength laser according to claim 5, further comprising a second ring core disposed in the cladding member and having a refractive index higher than that of a material of the cladding member, wherein
   the first ring core and the second ring core has a circumferential length different from each other.

7. The external resonator by a variable wavelength laser according to claim 1, further comprising a non-reflective coating at a connection interface between the cladding member and the amplifier.

8. An optical waveguide comprising:
   a cladding member; and
   a core disposed in the cladding member and having a refractive index higher than that of a material of the cladding member, wherein
   the core comprises a first portion and a second portion,
   the first portion has a cross section having a first length in width direction and a second length in thickness direction, the first length being 10 times or more than the second length
   the second portion tapers toward an end of the core coupled with an optical waveguide element, and adjusts a beam spot size at the end of the core to a beam spot size at the optical waveguide element, and
   the end of the core has a cross section having the second length in thickness direction.

9. The optical waveguide according to claim 8, wherein the second portion tapers from substantially 1.0 µm to substantially 0.3 µm.

10. The optical waveguide according to claim 8, wherein the second portion tapers exponentially.

11. The optical waveguide according to claim 8, wherein the second portion tapers linearly.

12. The optical waveguide according to claim 8 further comprising:
    a first ring core disposed in the cladding member and having a refractive index higher than that of a material of the cladding member, wherein
    the first ring core has a cross section having a third length in width direction and the second length in thickness direction, the third length being 10 times or more than the second length.

13. The optical waveguide according to claim 12 further comprising:
    a second ring core disposed in the cladding member and having a refractive index higher than that of a material of the cladding member, wherein
    the first ring core and the second ring core has a circumferential length different from each other.

* * * * *

UNITED STATES PATENT AND TRADEMARK OFFICE
CERTIFICATE OF CORRECTION

PATENT NO. : 10,263,392 B2  
APPLICATION NO. : 15/870231  
DATED : April 16, 2019  
INVENTOR(S) : Naoki Kobayashi and Kenji Sato Page 1 of 1

It is certified that error appears in the above-identified patent and that said Letters Patent is hereby corrected as shown below:

In the Claims

Column 9, Line 24; In Claim 1, delete "compromising" and insert --comprising-- therefor Column 9, Line 25; In Claim 1, delete "wavelength" and insert --waveguide-- therefor Column 9, Line 25; In Claim 1, delete "adjust" and insert --adjusts-- therefor Column 9, Line 27; In Claim 1, delete "waveguide," and insert --waveguide-- therefor Signed and Sealed this  
Twentieth Day of August, 2019

Andrei Iancu  
*Director of the United States Patent and Trademark Office*